US012768036B2

(12) United States Patent
Hong et al.

(10) Patent No.: US 12,768,036 B2
(45) Date of Patent: Oct. 20, 2026

(54) AMORPHOUS CARBON COATING METHOD FOR RUBBER ROLLER

(71) Applicant: INNOTION TECH CO., LTD., Siheung-si (KR)

(72) Inventors: Jeong Ki Hong, Siheung-si (KR); In Ki Hong, Siheung-si (KR); Myoung Ki Hong, Ulsan (KR); Sung Gyu Hong, Gimpo-si (KR)

(73) Assignee: INNOTION TECH CO., LTD, Siheung-si (KR)

( * ) Notice: Subject to any disclaimer, the term of this patent is extended or adjusted under 35 U.S.C. 154(b) by 0 days.

(21) Appl. No.: 19/136,226

(22) PCT Filed: Oct. 2, 2024

(86) PCT No.: PCT/KR2024/015022
§ 371 (c)(1),
(2) Date: Jun. 5, 2025

(87) PCT Pub. No.: WO2026/038607
PCT Pub. Date: Feb. 19, 2026

(65) Prior Publication Data
US 2026/0049395 A1 Feb. 19, 2026

(30) Foreign Application Priority Data
Aug. 16, 2024 (KR) ........................ 10-2024-0109662

(51) Int. Cl.
*C23C 16/27* (2006.01)
*C23C 14/02* (2006.01)
(Continued)

(52) U.S. Cl.
CPC .......... *C23C 16/276* (2013.01); *C23C 14/022* (2013.01); *C23C 14/0611* (2013.01);
(Continued)

(58) Field of Classification Search
None
See application file for complete search history.

(56) References Cited

U.S. PATENT DOCUMENTS 5,464,667 A * 11/1995 Kohler .............. H01J 37/32596 427/574
2015/0099123 A1* 4/2015 Barbee .................... C23C 16/26 428/408
2025/0171907 A1 5/2025 Hong et al.

FOREIGN PATENT DOCUMENTS

JP 2009-035819 A 2/2009
JP 4859673 B2 11/2011
(Continued)

OTHER PUBLICATIONS

Machine Translation of JP 2009035819 A (Year: 2009).*
(Continued)

*Primary Examiner* — Shamim Ahmed
*Assistant Examiner* — Bradford M Gates
(74) *Attorney, Agent, or Firm* — Ladas & Parry LLP

(57) ABSTRACT

The present invention relates to a carbon coating method for a rubber roller, in which a DLC (Diamond-Like Carbon) coating is applied to the surface of the rubber roller using an ion source. In order to prevent problems such as surface cracks caused by heat and ultraviolet radiation generated during the plasma-based coating process, the method controls the coating cycle by distributing the coating time and aging time (also referred to as cooling time) into a single unit coating cycle.

11 Claims, 2 Drawing Sheets

(51) Int. Cl.

| | |
|---|---|
| ***C23C 14/06*** | (2006.01) |
| ***C23C 14/46*** | (2006.01) |
| ***C23C 14/58*** | (2006.01) |
| ***C23C 16/02*** | (2006.01) |
| ***C23C 16/56*** | (2006.01) |
| ***C23C 28/04*** | (2006.01) |

(52) U.S. Cl.

CPC .......... *C23C 14/46* (2013.01); *C23C 14/5806* (2013.01); *C23C 16/0245* (2013.01); *C23C 16/56* (2013.01); *C23C 28/04* (2013.01)

(56) References Cited

FOREIGN PATENT DOCUMENTS

| | | | |
|---|---|---|---|
| JP | 2016-014161 | A | 1/2016 |
| KR | 10-2008-0082321 | A | 9/2008 |
| KR | 10-2015-0008728 | A | 1/2015 |
| KR | 10-1709538 | B1 | 2/2017 |
| KR | 10-2019-0071231 | A | 6/2019 |
| KR | 10-2639397 | B1 | 2/2024 |
| KR | 10-2803222 | B1 | 5/2025 |

OTHER PUBLICATIONS

Machine Translation of JP 2016014161 A (Year: 2016).*

ISR for International Application PCT/KR2024/015022 dated May 4, 2025.

Written Assertion for International Application PCT/KR2024/015022 dated May 4, 2025.

Notification of Examination Result (Office Action) issued by the Korean Intellectual Property Office (KIPO) for copending application 10-2024-0109662 mailed on Oct. 11, 2024.

Decision to Grant issued by KIPO for copending application 10-2024-0109662 mailed on Apr. 27, 2025.

* cited by examiner

[FIG1]
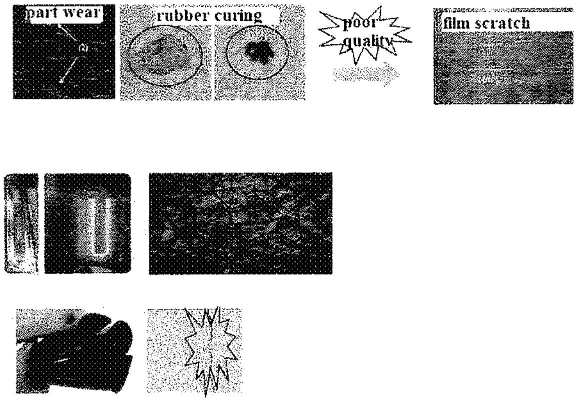
[FIG2]
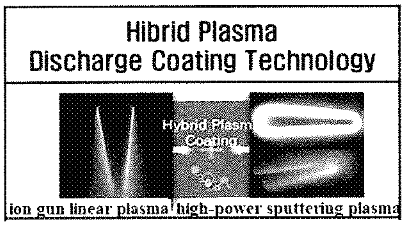
[FIG 3]
| classification | door side | chamber side |
|---|---|---|
| before coating | 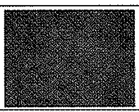 | 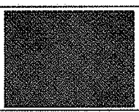 |
| after coating | 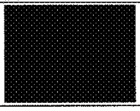 | 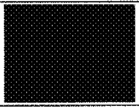 |
[FIG 4]
| section | before coating | after coating |
|---|---|---|
| micrograph | 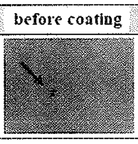 | 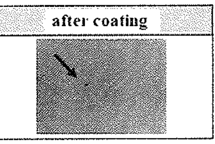 |
[FIG5]
| specimen position | door side | chamber side |
|---|---|---|
| #1 jig (SKD11) | 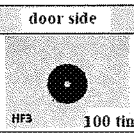 HF3 100 times | 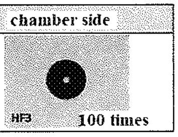 HF3 100 times |
HF1

[FIG 6]
| section | rubber sheet material | rubber surface image | surface image after plasma coating | |
|---|---|---|---|---|
| | | camera | camera | X50 [optical microscope] |
| 1] | NBR [nitrile-based] | 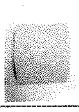 | 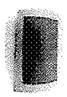 | 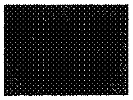 |
| 2] | Si [silicone-based] |  |  | 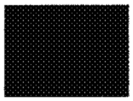 |
| 3] | EPDM [ethylene-based] |  |  | 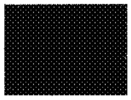 |
| 4] | PU [polyurethane-based] | 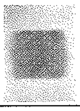 | 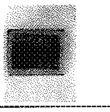 | 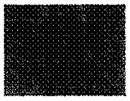 |

AMORPHOUS CARBON COATING METHOD FOR RUBBER ROLLER

CROSS-REFERENCE TO RELATED APPLICATIONS

This application is a national phase application of International application PCT/KR2024/015022 filed on Oct. 2, 2024 that claims the priority of Korean Patent Application No. 10-2024-0109662 filed on Aug. 16, 2024. The content of these applications is incorporated herein by reference in its entirety.

TECHNICAL FIELD

The present invention relates to surface treatment technology for rubber rollers, and more specifically, to a coating method for forming an amorphous carbon coating layer, such as DLC (Diamond-Like Carbon), on the surface of a rubber roller.

BACKGROUND OF THE INVENTION

In industries related to films (such as PET and secondary batteries), various rubber-coated rollers are used in manufacturing processes. For example, rubber rollers are employed in the production of secondary battery electrodes for applying active materials and facilitating electrolyte penetration. Additionally, rubber rollers are widely utilized in the manufacturing of optical films, display films, insulation layers for electronic components, precision parts, and more.

However, rubber rollers are prone to durability issues, leading to surface roughness changes due to wear and tear. They are also affected by environmental factors such as ultraviolet (UV) exposure and temperature variations, which can cause surface hardening and deformation. These surface deformations often result in product defects. For instance, deformation of rubber rollers can lead to scratches on the films produced using them.

Patent Publication No. 10-2015-0008728 discloses a technique in which acid-resistant rubber is applied to the surface of metal rollers in acid treatment lines. To enhance the lifespan of the rubber surface, a DLC (Diamond-Like Carbon) coating is utilized.

However, rubber rollers are inherently vulnerable to heat, which can cause surface deformation during the DLC coating process. Additionally, due to the soft nature of the material, cracks may form in the DLC coating layer, and the coating may break when tilted, ultimately failing to achieve the intended purpose of the DLC coating.

DETAILED DESCRIPTION OF THE INVENTION

Problem to be Solved

The objective of this invention is to perform DLC (Diamond-Like Carbon) coating on the surface of industrial rubber rollers using plasma while ensuring that cracks do not form on the coated surface during the coating process. Additionally, the coating layer should remain intact even when the rubber roller is tilted.

Means for Solving the Problem

To achieve this objective, the invention involves applying DLC(Diamond-Like Carbon) coating to the rubber roller surface using an ion source. During the plasma coating process, heat and ultraviolet (UV) exposure may cause cracks to develop on the rubber roller surface. To prevent such issues, the coating time and aging time (also referred to as cooling time) are precisely distributed and incorporated into a single coating cycle. By controlling the coating cycle, this method ensures effective carbon coating on rubber rollers without compromising their integrity.

In summary, the present invention provides a method for forming a DLC (Diamond-Like Carbon) coating layer on the surface of a rubber roller, wherein the method comprises alternately repeating a deposition process and a cooling process for DLC coating layer formation, and the DLC coating layer is formed within a time limit that does not cause deformation of the rubber roller surface, followed by a cooling period.

In the above method, the formation of a DLC coating layer on the surface of a rubber roller is characterized in that the ratio of deposition time to cooling time is set within a range of 1:⅓ to 1.

In the above method, the formation of a DLC coating layer on the surface of a rubber roller is characterized by employing one of PECVD (Plasma Enhanced Chemical Vapor Deposition), ion plating, laser ablation, or filtered vacuum arc plasma.

In the above method, the formation of a DLC coating layer takes place within a vacuum chamber, where a rubber roller is placed and vacuumized, followed by plasma cleaning prior to vacuum deposition, during which an inert gas is introduced into the chamber to generate plasma, with a cleaning time selected within a range of 20 to 40 minutes and a cooling time selected within a range of 15 to 30 minutes, thereby incorporating a cooling period after plasma cleaning.

In the above method, after the cooling time following plasma cleaning has elapsed, a buffer layer is formed prior to DLC coating layer formation, wherein the buffer layer includes at least one of CrN and CrC, TiN and TiC, or WN and WC and is deposited using a PVD source equipped with a sputter target of Cr, Ti, or W,

- the formation of CrN, TiN, or WN layers is carried out by applying power to a PVD source with a sputter target while supplying an inert gas and nitrogen ($N_2$), initially supplying only the inert gas and gradually increasing the nitrogen ($N_2$) supply to form a gradient layer,
- the formation of CrC, TiC, or WC layers is performed by applying power to a PVD source with a sputter target while supplying an inert gas and hydrocarbon gas,
- a cooling time is provided, and the ratio of buffer layer formation time to cooling time is set within a range of 1:⅓ to 1.

In the above method, after forming a buffer layer, hydrocarbon is supplied to a linear ion source, and a bias is applied to the rubber roller to form DLC, wherein the coating process consists of three cycles, each comprising a coating time of 18 to 33 minutes and a cooling time of 8 to 33 minutes, followed by an additional coating step lasting 18 to 33 minutes, thereby completing a total of four cycles to form a DLC coating layer on the surface of the rubber roller.

In the above method, in the final cycle of DLC coating layer formation, a coating time of 18 to 33 minutes is followed by an additional cooling period of 8 to 33 minutes, thereby completing the process of forming a DLC coating layer on the surface of the rubber roller.

"In the above method, plasma cleaning is carried out by supplying an inert gas such as Ar to a linear ion source at a flow rate of 50 to 300 sccm, applying a current of 0.5 to 2.0

A and a voltage of 1000 to 2000V to generate plasma, and applying a bias current of 0.5 to 0.9 A and a bias voltage of 50 to 300V to the rubber roller, thereby forming a DLC coating layer on the surface of the rubber roller.

In the above method, the formation of a buffer layer is carried out using a first sputter source and a second sputter source, wherein an inert gas is supplied to the vacuum chamber at a flow rate of 100 to 300 sccm, and a current of 5 to 20 A and a voltage of 300 to 1000V are applied to the first and second sputter sources, while a bias current of 0.3 to 0.5 A and a bias voltage of 50 to 300V are applied to the rubber roller for 7.5 to 8.5 minutes (Step 1);

subsequently, an inert gas at a flow rate of 100 to 300 sccm and nitrogen at a flow rate of 6 to 8 sccm are supplied to the vacuum chamber, and a current of 5 to 20 A and a voltage of 300 to 1000V are applied to the first and second sputter sources, while a bias current of 0.25 to 0.35 A and a bias voltage of 50 to 300V are applied to the rubber roller for 3.5 to 4.5 minutes (Step 2);

thereafter, an inert gas at a flow rate of 100 to 300 sccm and nitrogen at a flow rate of 9 to 11 sccm are supplied to the vacuum chamber, and a current of 5 to 20 A and a voltage of 300 to 1000V are applied to the first and second sputter sources, while a bias current of 0.3 to 0.5 A and a bias voltage of 50 to 300V are applied to the rubber roller for 3.5 to 4.5 minutes (Step 3);

next, an inert gas at a flow rate of 100 to 300 sccm and nitrogen at a flow rate of 12 to 14 sccm are supplied to the vacuum chamber, and a current of 5 to 20 A and a voltage of 300 to 1000V are applied to the first and second sputter sources, while a bias current of 0.3 to 0.5 A and a bias voltage of 50 to 300V are applied to the rubber roller for 3.5 to 4.5 minutes (Step 4);

finally, an inert gas at a flow rate of 100 to 300 sccm and hydrocarbon gas at a flow rate of 15 to 17 sccm are supplied to the vacuum chamber, and a current of 5 to 20 A and a voltage of 300 to 1000V are applied to the first and second sputter sources, while a bias current of 0.3 to 0.5 A and a bias voltage of 50 to 300V are applied to the rubber roller for 6.5 to 7.5 minutes (Step 5), followed by a cooling time of 18 to 22 minutes, thereby forming a DLC coating layer on the surface of the rubber roller.

In the above method, DLC coating layer formation is carried out using a linear ion source, wherein a current of 0.5 to 2.0 A and a voltage of 1000 to 2000V are applied to the linear ion source, while hydrocarbon gas is supplied at a flow rate of 50 to 200 sccm, and a bias current of 0.5 to 0.7 A and a bias voltage of 50 to 300V are applied to the rubber roller to form the DLC layer, with the coating process consisting of three cycles, each comprising a coating time of 18 to 33 minutes and a cooling time of 8 to 33 minutes, followed by an additional coating step lasting 18 to 33 minutes, thereby completing a total of four cycles to form a DLC coating layer on the surface of the rubber roller.

In the above method, in the final fourth cycle, a coating time of 18 to 33 minutes is followed by an additional cooling period of 8 to 33 minutes, thereby forming a DLC coating layer on the surface of the rubber roller.

In the above method, a DLC coating layer is formed on the surface of a rubber roller, wherein fluorine (F)-containing gas or silicon (Si)-containing gas is additionally supplied to the linear ion source to achieve fluorine- or silicon-doped DLC coating.

In this method, a gas containing F or a gas containing Si is additionally supplied to the linear ion source, thereby forming an F-doped or Si-doped DLC (Diamond-Like Carbon) coating, and characterizing the method for forming a DLC coating layer on the surface of a rubber roller.

A rubber roller manufactured by the above method, wherein the surface roughness (Ra) of the DLC coating layer applied to the rubber roller ranges from 0.61 to 0.68 μm.

A DLC coating material formed on the surface of a rubber roller by the above-described method, is provided.

The DLC coating material present on the surface of a rubber roller is characterized by a surface roughness (Ra) ranging from 0.61 to 0.68 μm.

The present invention also provides a coating system for forming a DLC coating layer on the surface of a rubber roller, comprising:

a vacuum chamber;

a linear ion source and a sputter source mounted in the vacuum chamber;

an ion guiding device including a magnet or an electromagnet installed in the linear ion source to densify ions and plasma toward the rubber roller as the target substrate;

a raw material supply unit that supplies material to the linear ion source;

a jig for securing and rotating the rubber roller;

a power supply unit that provides power to the linear ion source and sputter source and applies bias power to the rubber roller; and a process control unit for alternately conducting coating and cooling processes, wherein the process control unit controls the power supply unit to alternately repeat the deposition and cooling processes for DLC coating layer formation within a time limit that prevents deformation of the rubber roller surface, followed by a cooling period.

In the above method, a DLC coating layer is formed on the surface of a rubber roller, wherein fluorine (F)-containing gas or silicon (Si)-containing gas is additionally supplied to the linear ion source to achieve fluorine- or silicon-doped DLC coating.

A rubber roller manufactured by the above method, wherein the surface roughness (Ra) of the DLC coating layer applied to the rubber roller ranges from 0.61 to 0.68 μm.

A DLC coating material formed by the above method and present on the surface of a rubber roller is provided.

The DLC coating material present on the surface of a rubber roller is characterized by a surface roughness (Ra) ranging from 0.61 to 0.68 μm.

Effect of the Invention

According to the present invention, issues observed in conventional DLC coating of rubber rollers using ion sources—such as surface hardening, crack formation, and coating layer breakage during tilting—are resolved.

Specifically, the present invention enables the formation of a high-quality DLC (Diamond-Like Carbon) coating layer by preventing deformation of the rubber surface, which is vulnerable to heat and ultraviolet radiation generated by ions and plasma from the ion source, as well as thermal accumulation inside the process chamber. This is achieved by dividing the coating time into predetermined unit intervals and introducing a cooling gas into the chamber during an aging period following each coating interval.

In this manner, by alternately performing coating and aging steps, a high-quality DLC (Diamond-Like Carbon)

coating can be formed on rubber materials that are highly susceptible to thermal deformation.

According to the present invention, the DLC (Diamond-Like Carbon) coating layer formed on the surface of the rubber roller exhibits excellent surface quality, with a surface roughness (Ra) in the range of 0.61 to 0.68 μm, Rz in the range of 3.74 to 3.84 μm, and Ry in the range of 4.46 to 4.73 μm.

In addition, according to the present invention, the DLC (Diamond-Like Carbon) coating layer formed on the surface of the rubber roller exhibits enhanced durability, with a hardness in the range of 13.5 to 28 GPa and 1300 to 2700 Hv, thereby ensuring long-term service life.

BRIEF DESCRIPTION OF THE DRAWINGS

FIG. 1 is a photograph showing the surface hardening issue of a rubber roller and the occurrence of cracks and breakage in the coating layer formed by conventional techniques.

FIG. 2 is a schematic diagram illustrating the hybrid plasma coating system according to the present invention.

FIG. 3 is a photograph showing the surface of a rubber roller before and after carbon coating is applied according to the present invention.

FIG. 4 is a microscopic photograph showing that stains (scratches) originally present on the surface of the rubber roller are covered by the carbon coating according to the present invention.

FIG. 5 is a photograph showing the result of an adhesion test (indentation test) performed on the carbon-coated surface of a rubber roller according to the present invention.

FIG. 6 is a photograph showing the result of a tilting test performed on the carbon-coated surface of a rubber roller according to the present invention.

BEST MODE FOR CARRYING OUT THE INVENTION

Hereinafter, preferred embodiments of the present invention will be described in detail with reference to the accompanying drawings.

The rubber roller having a DLC (Diamond-Like Carbon) coating layer formed according to the present invention is an industrial rubber roller applicable to various industries, including secondary battery electrode manufacturing.

The rubber material may include various types such as NBR, EPDM, silicone, and polyurethane (PU).

FIG. 1 is a photograph showing surface hardening of a rubber roller and the occurrence of cracks and breakage in the coating layer formed by conventional techniques. It illustrates that scratches occur on films produced using rubber rollers due to surface hardening, and that cracks appear in the DLC coating layer applied using an ion source, with breakage observed during tilting tests.

These issues occur even when the coating process is performed at room temperature, because the ions and plasma supplied into the chamber by the ion source generate heat and ultraviolet radiation, resulting in an actual process temperature of approximately 70 to 80° C. In other words, although the process starts at room temperature, the heat generated during coating deforms the rubber roller surface, and the ultraviolet radiation emitted by the plasma further contributes to such deformation.

Therefore, in order to form a DLC (Diamond-Like Carbon) coating layer on the rubber roller surface without cracks, the present invention adopts a method in which the coating and aging (cooling) processes are alternately performed as a single unit cycle to control heat generation during the coating process. Specifically, by maintaining the ratio of the coating time to the cooling time within the range of 1:⅓ to 1, deformation of the rubber roller is prevented during the coating process. This alternating method of coating and aging can be applied to various DLC coating processes, including PECVD (Plasma Enhanced Chemical Vapor Deposition), ion plating, laser ablation, and filtered vacuum arc plasma.

The present invention is based on PECVD (Plasma Enhanced Chemical Vapor Deposition) using a linear ion source and performs DLC (Diamond-Like Carbon) coating by employing a hybrid plasma coating system that includes an additional PVD (Physical Vapor Deposition) source (sputter source) for forming a buffer layer. The buffer layer may include combinations such as CrN/CrC, TiN/TiC, or WN/WC.

FIG. 2 is a schematic diagram illustrating the hybrid plasma coating system according to the present invention.

The hybrid plasma coating system combines a PVD source and a linear ion source. The linear ion source is further equipped with an ion guiding device based on a magnet or electromagnet, which densifies the generated plasma around the rubber roller to be coated. Two PVD sources and two linear ion sources may be arranged, and these sources can be radially positioned within the chamber.

The DLC (Diamond-Like Carbon) coating process for a rubber roller using the hybrid plasma coating system is as follows.

The rubber roller is loaded into the chamber and vacuumized to a pressure of $10^{-4}$ to $10^{-3}$ torr. At room temperature, an inert gas such as Ar is supplied to the linear ion source at a flow rate of 50 to 300 sccm, and a current of 0.5 to 2.0 A and a voltage of 1000 to 2000 V are applied to generate plasma for plasma cleaning. A bias current of approximately 0.5 to 0.9 A and a bias voltage of 50 to 300 V may be applied to the rubber roller. The shaft of the rubber roller, being metallic, may be used to apply the bias. The cleaning time is selected within the range of 20 to 40 minutes, and a cooling time of 15 to 30 minutes is provided after plasma cleaning. The cleaning time is determined within a range that does not cause deformation of the rubber roller surface, and the cooling step is applied thereafter to protect the surface. The cooling period may be achieved by pausing the process or by supplying an inert gas at room temperature at a flow rate of 80 to 100 sccm.

After the cleaning step, a buffer layer is formed using the PVD source of the plasma coating system.

The buffer layer is composed of a CrN layer and a CrC layer; specifically, the CrN layer is formed on the base material, followed by the CrC layer. Power is applied to the PVD source equipped with a Cr sputter target, and an inert gas such as Ar and nitrogen ($N_2$) are supplied. The process is carried out while applying a bias to the rubber roller. After the buffer layer is formed, a cooling period is again provided.

During the formation of the CrN layer, only an inert gas (Ar) is initially supplied, and the nitrogen supply is gradually increased to form a gradient layer. In the final stage of the buffer layer formation, a hydrocarbon gas is supplied to improve adhesion.

Specifically:

(Step 1) An inert gas is supplied at 100 to 300 sccm. A current of 5 to 20 A and a voltage of 300 to 1000 V are applied to both the first and second sputter sources (the voltage for the second sputter source may be slightly higher). A bias current of 0.3 to 0.5 A and a bias voltage of 50 to 300 V are applied to the rubber roller, and the process is conducted for 7.5 to 8.5 minutes.

(Step 2) An inert gas (100 to 300 sccm) and nitrogen gas (6 to 8 sccm) are supplied. A current of 5 to 20 A and a voltage of 300 to 1000 V are applied to the sputter sources (the voltage for the second sputter source may be slightly lower). A bias current of 0.25 to 0.35 A and a bias voltage of 50 to 300 V are applied to the rubber roller, and the process is carried out for 3.5 to 4.5 minutes.

(Step 3) An inert gas (100 to 300 sccm) and nitrogen gas (9 to 11 sccm) are supplied. A current of 5 to 20 A and a voltage of 300 to 1000 V are applied to the sputter sources. A bias current of 0.3 to 0.5 A and a bias voltage of 50 to 300 V are applied to the rubber roller, and the process is performed for 3.5 to 4.5 minutes.

(Step 4) An inert gas (100 to 300 sccm) and nitrogen gas (12 to 14 sccm) are supplied. A current of 5 to 20 A and a voltage of 300 to 1000 V are applied to the sputter sources (the voltage for the second sputter source may be slightly higher). A bias current of 0.3 to 0.5 A and a bias voltage of 50 to 300 V are applied to the rubber roller, and the process is conducted for 3.5 to 4.5 minutes.

(Step 5) An inert gas (100 to 300 sccm) and a hydrocarbon gas ($C_2H_2$) at 15 to 17 sccm are supplied. A current of 5 to 20 A and a voltage of 300 to 1000 V are applied to the sputter sources. A bias current of 0.3 to 0.5 A and a bias voltage of 50 to 300 V are applied to the rubber roller, and the process is conducted for 6.5 to 7.5 minutes.

After these steps, a cooling time of 18 to 22 minutes is provided. During this period, either an inert gas at room temperature is supplied, or the system is placed in a resting state without gas supply.

In the above, when the buffer layer is composed of TiN/TiC, the same process is carried out using a Ti target in the sputter source. Likewise, when the buffer layer is composed of WN/WC, the process is performed using a W target in the sputter source.

Next, a DLC (Diamond-Like Carbon) coating is applied onto the buffer layer.

In this method, a current of 0.5 to 2.0 A and a voltage of 1000 to 2000 V are applied to each of the linear ion sources (two linear ion sources are used in this embodiment). A hydrocarbon gas such as $C_2H_2$ is supplied at a flow rate of 50 to 200 sccm. A bias current of 0.5 to 0.7 A and a bias voltage of 50 to 300 V are applied to the rubber roller to form the DLC (Diamond-Like Carbon) coating. The coating is performed over four cycles, each consisting of a coating time of 18 to 33 minutes followed by a cooling time of 8 to 33 minutes. In the final cycle, the cooling time following the 18 to 33-minute coating may be omitted.

In this manner, by alternately performing coating and aging steps, a high-quality DLC (Diamond-Like Carbon) coating can be formed on rubber materials that are highly susceptible to thermal deformation.

Meanwhile, one or more of a hydrocarbon gas, $CF_4$ gas, and a silicon-containing gas such as TMS (tetramethylsilane), $SiH_4$, $Si_2H_6$, or $SiH_2Cl_2$ may be supplied to the raw material supply unit of the linear ion source. In addition, hydrogen ($H_2$) may be further supplied to create a reducing atmosphere. By repeating the coating and cooling steps under these conditions, a ternary nanocomposite coating layer can be formed on the surface of the rubber roller.

The above process is carried out using the following coating system.

The above process is carried out using a coating system comprising:

- a vacuum chamber;
- a linear ion source and a sputter source mounted in the vacuum chamber;
- an ion guiding device, including a magnet or an electromagnet, installed in the linear ion source to densify ions and plasma toward the rubber roller to be coated;
- a raw material supply unit for supplying material to the linear ion source;
- a jig for fixing and rotating the rubber roller;
- a power supply unit for supplying power to the linear ion source, the sputter source, or the ion guiding device, and for applying bias power to the rubber roller; and
- a process control unit for alternately performing coating and cooling processes;
- wherein the process control unit controls the power supply such that the deposition and cooling processes for forming the DLC (Diamond-Like Carbon) coating layer are alternately repeated, thereby forming the DLC coating layer within a time range that does not deform the surface of the rubber roller, and subsequently providing a cooling period.

The process control unit also controls the plasma cleaning and buffer layer formation processes, as described above, by alternately allocating process time and aging time (cooling time).

The surface roughness of the DLC (Diamond-Like Carbon) coating layer manufactured according to the present invention is Ra in the range of 0.61 to 0.68 μm, Rz in the range of 3.74 to 3.84 μm, and Ry in the range of 4.46 to 4.73 μm.

The thickness of the DLC (Diamond-Like Carbon) layer may be in the range of 0.3 to 5.0 μm, and the thickness of the buffer layer may be in the range of 0.2 to 1.0 μm.

In addition, according to the present invention, the DLC (Diamond-Like Carbon) coating layer formed on the surface of the rubber roller has enhanced durability, with a hardness in the range of 13.5 to 28 GPa and 1300 to 2700 Hv, thereby ensuring long-term service life.

In the above, when forming the DLC (Diamond-Like Carbon) coating layer, a gas containing F and/or a gas containing Si may additionally be supplied to the linear ion source to form F-DLC, Si-DLC, or DLC doped with both F and Si.

FIG. 3 is a photograph showing the surface of a rubber roller before and after carbon coating is applied according to the present invention. It can be visually confirmed that the coated surface is uniform and of high quality.

FIG. 4 is a microscopic photograph showing that stains (scratches) originally present on the surface of the rubber roller are covered by the carbon coating according to the present invention.

FIG. 5 is a photograph showing the result of an adhesion test (indentation test) conducted on the carbon-coated surface of a rubber roller according to the present invention. The test results indicated HF1 and HF3 levels.

FIG. 6 is a photograph showing the result of a tilting test conducted on the carbon-coated surface of a rubber roller according to the present invention. No breakage of the coating is observed during tilting, even under optical microscope observation.

In this manner, a high-quality DLC (Diamond-Like Carbon) coating layer having high hardness, low friction, and excellent chemical resistance can be effectively implemented on the surface of a rubber roller, which is vulnerable to heat.

Unless otherwise defined, all technical and scientific terms used in the present specification have the same meanings as commonly understood by one of ordinary skill in the art to which the present invention belongs. Terms defined in commonly used dictionaries should be interpreted as having meanings consistent with their ordinary usage in the relevant art and should not be interpreted in an idealized or overly formal sense unless expressly defined otherwise. Throughout the specification, when a component is referred to as being "included" or "comprising" another component, it does not exclude the possibility of including additional components unless otherwise explicitly stated. Also, the singular forms shall include the plural forms unless the context clearly dictates otherwise.

In addition, in the present specification, expressions such as "on," "above," or "upper" and "under" or "lower" refer to positions relative to the target part, and do not necessarily mean positions located in the upward or downward direction with respect to gravity.

The scope of rights of the present invention is not limited to the embodiments described above but is defined by the claims. It will be apparent to those skilled in the art that various modifications and variations can be made within the scope of the claims.

INDUSTRIAL APPLICABILITY

The present invention is applicable to industrial rubber-coated rollers, including rubber-coated rollers used in secondary battery manufacturing processes, various rubber-coated rollers employed in film production industries, and wringer rollers used in acid cleaning lines for metal surface treatment.

The invention claimed is:

1. A method for forming a DLC (Diamond-Like Carbon) coating layer on a surface of a rubber roller, the method comprising:

alternately repeating a deposition process for forming the DLC coating layer and a cooling process in order to prevent deformation of the rubber roller surface caused by heat generation or ultraviolet radiation emitted by plasma during the coating process, wherein the DLC coating layer is formed within a time range that does not cause deformation of the rubber roller surface, followed by a cooling period, wherein the cooling process comprises either pausing the process or supplying an inert gas at room temperature into the chamber, the ratio of a deposition time to a cooling time for forming the DLC coating layer is in the range of 1:⅓ to 1, wherein a buffer layer is formed prior to the formation of the DLC (Diamond-Like Carbon) coating layer, the buffer layer comprises one of CrN and CrC, TiN and TiC, or WN and WC, and is formed using a physical Vapor Deposition (PVD) source equipped with a sputter target of one of Cr, Ti, or W;

the formation of the CrN, TiN, or WN layer is carried out by applying power to the PVD source equipped with the sputter target and supplying an inert gas and nitrogen ($N_2$), wherein only the inert gas is supplied at the initial stage and the nitrogen supply is gradually increased to form a gradient layer;

the CrC, TiC, or WC layer is formed by applying power to the PVD source equipped with the sputter target and supplying an inert gas and a hydrocarbon gas;

the cooling time is provided after the buffer layer formation; and a ratio of a buffer layer formation time to the cooling time after the buffer layer formation is in the range of 1: ⅓ to 1.

2. The method of claim 1, wherein the method for forming the DLC (Diamond-Like Carbon) coating layer comprises one of PECVD (Plasma Enhanced Chemical Vapor Deposition), ion plating, laser ablation, and filtered vacuum arc plasma.

3. The method of claim 2, wherein the DLC (Diamond-Like Carbon) coating layer is formed using a linear ion source, and a current of 0.5 to 2.0 A and a voltage of 1000 to 2000 V are applied to the linear ion source, a hydrocarbon gas is supplied at a flow rate of 50 to 200 sccm, and a bias current of 0.5 to 0.7 A and a bias voltage of 50 to 300 V are applied to the rubber roller to form the DLC coating layer, wherein the coating is performed in three cycles, each consisting of a coating time of 18 to 33 minutes and a cooling time of 8 to 33 minutes, and an additional fourth coating is performed for 18 to 33 minutes, completing a total of four coating cycles.

4. The method of claim 3, wherein, after the 18 to 33-minute coating process in the fourth and final cycle, an additional cooling time of 8 to 33 minutes is provided.

5. The method of claim 1, wherein the DLC (Diamond-Like Carbon) coating layer is formed in a vacuum chamber, and the method comprises:

loading the rubber roller into the vacuum chamber and performing vacuumization;

performing plasma cleaning prior to vacuum deposition for forming the DLC coating layer, wherein the plasma cleaning is conducted by supplying an inert gas into the vacuum chamber and generating plasma, selecting a cleaning time in the range of 20 to 40 minutes, and providing a cooling time in the range of 15 to 30 minutes, thereby providing a cooling period after plasma cleaning.

6. The method of claim 5, wherein, after the cooling time following the plasma cleaning, the buffer layer is formed prior to the formation of the DLC (Diamond-Like Carbon) coating layer.

7. The method of claim 6, wherein, after forming the buffer layer, a hydrocarbon gas is supplied to a linear ion source and a bias is applied to the rubber roller to form a DLC (Diamond-Like Carbon) coating layer, wherein the coating is performed in three cycles, each comprising a coating time of 18 to 33 minutes and a cooling time of 8 to 33 minutes, and an additional fourth coating is performed for 18 to 33 minutes, completing a total of four coating cycles.

8. The method of claim 7, wherein, in the final cycle of forming the DLC (Diamond-Like Carbon) coating layer, an additional cooling time of 8 to 33 minutes is provided after the 18 to 33-minute coating process.

9. The method of claim 7, wherein a gas containing F or a gas containing Si is additionally supplied to the linear ion source to form a DLC (Diamond-Like Carbon) coating layer doped with F or Si.

10. The method of claim 6, wherein the buffer layer is formed using a first and a second sputter source, and the method comprises:

(Step 1) supplying an inert gas into a vacuum chamber at a flow rate of 100 to 300 sccm, applying a current of 5 to 20 A and a voltage of 300 to 1000 V to the first and second sputter sources, and applying a bias current of 0.3 to 0.5 A and a bias voltage of 50 to 300 V to the rubber roller for 7.5 to 8.5 minutes;

(Step 2) supplying an inert gas at 100 to 300 sccm and nitrogen gas at 6 to 8 sccm into the vacuum chamber, applying a current of 5 to 20 A and a voltage of 300 to 1000 V to the first and second sputter sources, and applying a bias current of 0.25 to 0.35 A and a bias voltage of 50 to 300 V to the rubber roller for 3.5 to 4.5 minutes;

(Step 3) supplying an inert gas at 100 to 300 sccm and nitrogen gas at 9 to 11 sccm into the vacuum chamber, applying the same power conditions, and applying a bias current of 0.3 to 0.5 A and a bias voltage of 50 to 300 V to the rubber roller for 3.5 to 4.5 minutes;

(Step 4) supplying an inert gas at 100 to 300 sccm and nitrogen gas at 12 to 14 sccm into the vacuum chamber, applying a current of 5 to 20 A and a voltage of 300 to 1000 V to the sputter sources, and applying a bias current of 0.3 to 0.5 A and a bias voltage of 50 to 300 V to the rubber roller for 3.5 to 4.5 minutes;

(Step 5) supplying an inert gas at 100 to 300 sccm and a hydrocarbon gas at 15 to 17 sccm into the vacuum chamber, applying the same current and voltage to the sputter sources, and applying a bias current of 0.3 to 0.5 A and a bias voltage of 50 to 300 V to the rubber roller for 6.5 to 7.5 minutes; and providing an aging (cooling) time of 18 to 22 minutes after the steps above.

11. The method of claim 5, wherein the plasma cleaning is carried out by supplying an inert gas comprising Ar to a linear ion source at a flow rate of 50 to 300 sccm, applying a current of 0.5 to 2.0 A and a voltage of 1000 to 2000 V to generate plasma, and applying a bias current of 0.5 to 0.9 A and a bias voltage of 50 to 300 V to the rubber roller.

* * * * *